(12) United States Patent
Hshieh et al.

(10) Patent No.: US 7,049,194 B2
(45) Date of Patent: May 23, 2006

(54) TRENCH DMOS DEVICE WITH IMPROVED DRAIN CONTACT

(75) Inventors: Fwu-Iuan Hshieh, Saratoga, CA (US); Koon Chong So, Fremont, CA (US); William John Nelson, Danville, CA (US); John E. Amato, Tracy, CA (US)

(73) Assignee: General Semiconductor, Inc., Melville, NY (US)

( * ) Notice: Subject to any disclaimer, the term of this patent is extended or adjusted under 35 U.S.C. 154(b) by 0 days.

(21) Appl. No.: 10/725,326

(22) Filed: Dec. 1, 2003

(65) Prior Publication Data

US 2004/0108554 A1  Jun. 10, 2004

Related U.S. Application Data

(62) Division of application No. 10/021,419, filed on Oct. 30, 2001, now Pat. No. 6,657,255.

(51) Int. Cl.
*H01L 21/336* (2006.01)
(52) U.S. Cl. .................. 438/259; 438/270; 438/271
(58) Field of Classification Search ............ 438/156, 438/259, 270, 271; 257/335
See application file for complete search history.

(56) References Cited

U.S. PATENT DOCUMENTS

| 5,072,266 | A | | 12/1991 | Bulucea et al. ............. 257/330 |
|---|---|---|---|---|
| 5,393,999 | A | | 2/1995 | Malhi ........................ 257/289 |
| 5,430,316 | A | | 7/1995 | Contiero et al. ............ 257/335 |
| 5,463,241 | A | | 10/1995 | Kubo .......................... 257/376 |
| 5,541,425 | A | | 7/1996 | Nishihara .................... 257/139 |
| 5,665,996 | A | * | 9/1997 | Williams et al. ............ 257/401 |
| 5,674,766 | A | * | 10/1997 | Darwish et al. ............. 438/270 |
| 5,866,931 | A | | 2/1999 | Bulucea et al. ............. 257/331 |
| 5,925,911 | A | | 7/1999 | Okabe et al. ............... 257/341 |
| 5,945,709 | A | * | 8/1999 | Williams et al. ............ 257/343 |
| 6,194,761 | B1 | * | 2/2001 | Chiozzi et al. ............. 257/328 |

* cited by examiner

*Primary Examiner*—Phat X. Cao
(74) *Attorney, Agent, or Firm*—Mayer & Williams PC; Stuart H. Mayer, Esq.; Karin L. Williams, Esq.

(57) ABSTRACT

A trench DMOS transistor device that comprises: (a) a substrate of a first conductivity type; (b) an epitaxial layer of first conductivity type over the substrate, wherein the epitaxial layer has a lower majority carrier concentration than the substrate; (c) a trench extending into the epitaxial layer from an upper surface of the epitaxial layer; (d) an insulating layer lining at least a portion of the trench; (e) a conductive region within the trench adjacent the insulating layer; (f) a body region of a second conductivity type provided within an upper portion of the epitaxial layer and adjacent the trench; (g) a source region of first conductivity type within an upper portion of the body region and adjacent the trench; and (h) one or more low resistivity deep regions extending into the device from an upper surface of the epitaxial layer. The low resistivity deep region acts to provide electrical contact with the substrate, which is a common drain region for the device. By constructing a trench DMOS transistor device in this fashion, source, drain and gate contacts can all be provided on a single surface of the device.

2 Claims, 12 Drawing Sheets

TRENCH DMOS DEVICE WITH IMPROVED DRAIN CONTACT

This application is a division of U.S. patent application Ser. No. 10/021,419 entitled "Trench DMOS Device With Improved Drain Contact," filed on Oct. 30, 2001, U.S. Pat. No. 6,657,255.

FIELD OF THE INVENTION

The present invention relates to trench DMOS devices, and more particularly to trench DMOS devices with improved contact features.

BACKGROUND OF THE INVENTION

A DMOS (Double Diffused MOS) transistor is a type of MOSFET (Metal Oxide Semiconductor Field Effect Transistor) that uses diffusion to form the transistor region. DMOS transistors are typically employed as power transistors for high voltage power integrated circuits. DMOS transistors provide high current per unit area where low forward voltage drops are required.

One particular type of DMOS transistor is a so-called trench DMOS transistor in which the channel is formed vertically and the gate is formed in a trench extending between the source and drain. The trench, which is lined with a thin oxide layer and filled with polysilicon (i.e., polycrystalline silicon), allows less constricted current flow and thereby provides lower values of specific on-resistance. Examples of trench DMOS transistors are disclosed in U.S. Pat. Nos. 5,072,266, 5,541,425, and 5,866,931, the disclosures of which are hereby incorporated by reference.

Figure 1:
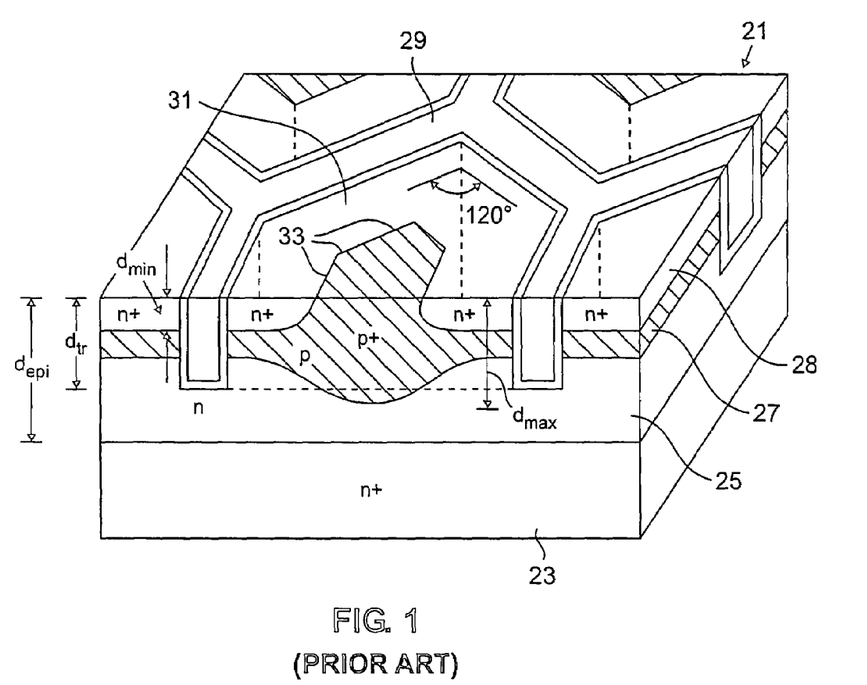
FIG. 1 is a schematic partial cross-sectional view of a trench DMOS transistor device in the prior art.

FIG. 1 illustrates half of a hexagonally shaped prior art trench DMOS structure 21. The structure includes an n+ substrate 23, upon which is grown a lightly doped n epitaxial layer 25 of a predetermined depth depi. Within the epi layer 25, p body region 27 (p, p+) is provided. In the design shown, the p body region 27 is substantially planar (except in a central region), lying a distance dmin below the top surface of the epi layer. Another layer 28 (n+) overlying most of the p body region 27 serves as source. A series of hexagonally shaped trenches 29 are provided in the epitaxial layer, opening toward the top and having a predetermined depth dtr. The trenches 29 are typically lined with oxide and filled with conductive polysilicon, forming the gate for the DMOS device. The trenches 29 define cell regions 31 that are also hexagonally shaped in horizontal cross-section. Within the cell region 31, the p body region 27 rises to the top surface of the epi layer and forms an exposed pattern 33 in a horizontal cross section at the top surface of the cell region 31. In the specific design illustrated, the p+ central portion of the p body region 27 extends to a depth dmax below the surface of the epi layer that is greater than the trench depth dtr for the transistor cell so that breakdown voltage is away from the trench surface and into the bulk of the semiconductor material.

A typical DMOS device includes numerous individual DMOS transistor cells 31 that are fabricated in parallel within a single chip (i.e., a section of a semiconductor wafer). Hence, the chip shown in FIG. 1 contains numerous hexagonal-shaped cells 31 (portions of five of these cells are illustrated). Cell configurations other than hexagonal configurations are commonly used, including square-shaped configurations. In a design like that shown in FIG. 1, the substrate region 23 acts as a common drain for all of the individual DMOS transistor cells 31. Although not illustrated, all the sources for the DMOS cells 31 are typically shorted together via a metal source contact that is disposed on top of the n+ source regions 28. An insulating region, such as borophosphosilicate glass (not shown) is typically placed between the polysilicon in the trenches 29 and the metal source contact to prevent the gate regions from being shorted with the source regions. Consequently, to make gate contact, the polysilicon within the trenches 29 is typically extended into a termination region beyond the DMOS cells 31, where a metal gate contact is provided on the polysilicon. Since the polysilicon gate regions are interconnected with one another via the trenches, this arrangement provides a single gate contact for all the gate regions of the device. As a result of this scheme, even though the chip contains a matrix of individual transistor cells 31, these cells 31 behave as a single large transistor.

Unfortunately, in a prior art design like that described above, contact with the drain is made from the underside of the chip, while source and gate contact is made from the topside of the chip. As a result, it is typically necessary to dispose the chip within a package that provides source, drain and gate contacts on a single surface.

SUMMARY OF THE INVENTION

According to one embodiment of the invention, a trench DMOS transistor device is provided that comprises: (a) a substrate of a first conductivity type; (b) an epitaxial layer of first conductivity type over the substrate, wherein the epitaxial layer has a lower majority carrier concentration than the substrate; (c) a trench extending into the epitaxial layer from an upper surface of the epitaxial layer; (d) an insulating layer lining at least a portion of the trench; (e) a conductive region within the trench adjacent the insulating layer; (f) a body region of a second conductivity type provided within an upper portion of the epitaxial layer and adjacent the trench; (g) a source region of first conductivity type within an upper portion of the body region and adjacent the trench; and (h) a low resistivity deep region extending into the device from an upper surface of the epitaxial layer. The low resistivity deep region acts to provide electrical contact with the substrate, which is a common drain region for the device.

Preferably, the low resistivity deep region has a resistivity of 0.01 Ohm-cm or less, extending at least 20% of the distance from the upper surface of the epitaxial layer to the substrate, and more preferably all the way to the substrate.

The deep region can comprise, for example, a doped region of first conductivity type within the epitaxial layer, a metallic region (such as aluminum), or a doped polysilicon region.

Preferably, the trench DMOS transistor device includes a plurality of transistor cells (typically of square-shaped or hexagonal geometry), which is preferably provided with a common source contact, a common drain contact and a common gate contact, each provided on a top surface of the device.

According to another embodiment of the invention, a trench DMOS transistor device is provided that comprises: (a) a silicon substrate of N-type conductivity; (b) a silicon epitaxial layer of the N-type conductivity type over the substrate, wherein the epitaxial layer has a lower majority carrier concentration than the substrate; (c) a trench extending into the epitaxial layer from an upper surface of the epitaxial layer; (d) a silicon oxide insulating layer lining at least a portion of the trench; (e) a doped polycrystalline silicon conductive region within the trench adjacent the insulating layer; (f) a body region of P-type conductivity provided within an upper portion of the epitaxial layer and adjacent the trench; (g) a source region of N-type conductivity provided within an upper portion of the body region and adjacent the trench; and (h) a low resistivity deep region extending from an upper surface of the epitaxial layer to the substrate, which is a common drain region for the device.

According to another embodiment of the invention, a method of forming a trench DMOS transistor device is provided. The method comprises: (a) providing a substrate of a first conductivity type; (b) depositing an epitaxial layer of the first conductivity type over the substrate, the epitaxial layer having a lower majority carrier concentration than the substrate; (c) forming a body region of a second conductivity type within an upper portion of the epitaxial layer; (d) etching a trench extending into the epitaxial layer from an upper surface of the epitaxial layer; (e) forming an insulating layer lining at least a portion of the trench; (f) forming a conductive region within the trench adjacent the insulating layer; (g) forming a source region of the first conductivity type within an upper portion of the body region and adjacent the trench; and (h) forming a low resistivity deep region extending into the device from an upper surface of the epitaxial layer. The deep region acts to provide electrical contact with the substrate, which is a common drain region for the device.

In some preferred cases, the deep region comprises a region of first conductivity type that is formed by an implantation and diffusion process within the epitaxial layer. In others, the deep region comprises a metallic or doped polysilicon region that is formed by a process comprising: (a) etching a deep trench that extends into the device from an upper surface of the epitaxial layer and (b) depositing metal or polysilicon within the trench.

One advantage of the present invention is that it improves the ability to make connections with a chip comprising numerous trench DMOS cells, by providing source, drain and gate contacts on the top of the chip.

Another advantage of the present invention is that the need for a separate package, in which source, drain and gate contacts are provided on a single surface, is eliminated.

These and other embodiments and advantages of the present invention will become immediately apparent to those of ordinary skill in the art upon review of the Detailed Description and claims to follow.

DETAILED DESCRIPTION OF THE INVENTION

The present invention now will be described more fully hereinafter with reference to the accompanying drawings, in which preferred embodiments of the present invention are shown. This invention may, however, be embodied in different forms and should not be construed as limited to the embodiments set forth herein.

Figure 2A:
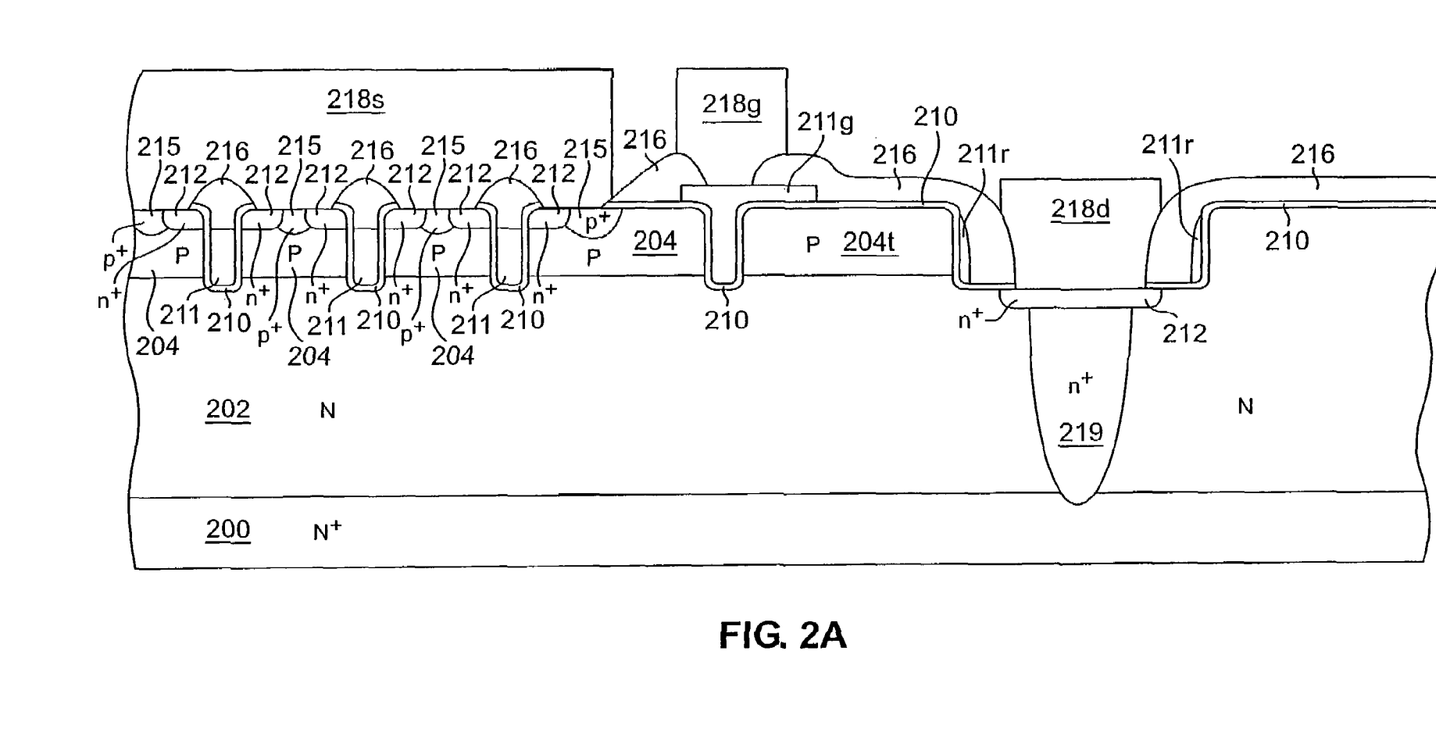
FIG. 2A is a schematic partial cross-sectional view of a trench DMOS transistor device, according to an embodiment of the present invention.

Turning now to FIG. 2A, a trench DMOS is shown in which an N-type epitaxial layer 202 is provided on an N+ substrate 200. The N+ substrate 200 is typically a silicon substrate having a thickness ranging, for example, from 10 to 25 mils and a resistivity ranging, for example, from 0.005 to 0.01 Ohm-cm. The N-type epitaxial layer 202 is also typically silicon having a thickness ranging from, for example, 5 to 10 mm and a resistivity ranging, for example, from 0.18 to 0.25 Ohm-cm.

Trenches formed within the epitaxial layer are lined with oxide layer 210 and are filled with polysilicon 211, providing the gate electrode function of the device. The oxide layer 210 is typically 500 to 700 Angstroms thick. The polysilicon 211 typically has a resistivity of 15 to 25 Ohm/sq. The trenches typically have a depth of 1.0 to 2.0 microns. The regions between the trenches are frequently referred to as mesas or trench mesas, based on their shapes.

Within the epitaxial layer are P-body regions that include both lower portions 204 and upper portions 215. The resistivity of the lower portions 204 of the P-body regions typically ranges from 0.1 to 3.0 Ohm-cm. The lower portions 204 typically extend into the epitaxial layer to a depth of 1.0 to 3.0 microns. The upper portions 215 of the P-body regions typically have resistivities ranging from 0.003 to 0.03 Ohm-cm, and they typically extend to a depth of 0.5 to 1.0 microns from the surface of the epitaxial layer. The upper regions 215 are provided to enhance device ruggedness. The other P-type regions 204t shown are involved in the termination of the trench segments.

The trench DMOS device of FIG. 2A also contains N+ source regions 212, which typically extend to a depth of 0.3 to 0.45 microns from the epitaxial layer surface and typically have resistivities of 0.001 to 0.003 Ohm-cm. Electrical contact is made with the N+ source regions 212 via metal source contact 218s.

A separate metal gate contact 218g is connected to the gate runner portion of the polysilicon 211g that is located outside of the region of the trench DMOS cells. The left-hand BPSG (borophosphosilicate glass) regions 216 prevent the polysilicon regions 211 associated with the gate electrodes from being shorted to the N+ source regions 212 through source contact 218s.

A metal drain contact 218d is also provided outside of the region of the trench DMOS cells. By placing the drain contact 218d on top of the device in a fashion analogous to the source contact 218s and gate contact 218g the ease of interconnection with other electronic components is improved.

The metal drain contact 218d is placed in electrical connection with the N+ substrate 200. Several methods are contemplated in connection with the present invention for making this connection.

For example, in the embodiment shown in FIG. 2A, this connection is made by means of a deep n+ region 219. Preferably, this deep n+ region has a resistivity ranging from 0.001 to 0.003 ohm-cm. This deep n+ region extends from the metal drain contact 218d to the N+ substrate 200. Although the deep n+ region 219 extends completely though the epitaxial layer 202 in the preferred embodiment shown, depending on the design requirements of the device, the deep n+ region 219 will only partially bridge the epitaxial layer 202 in other embodiments.

Figure 2B:
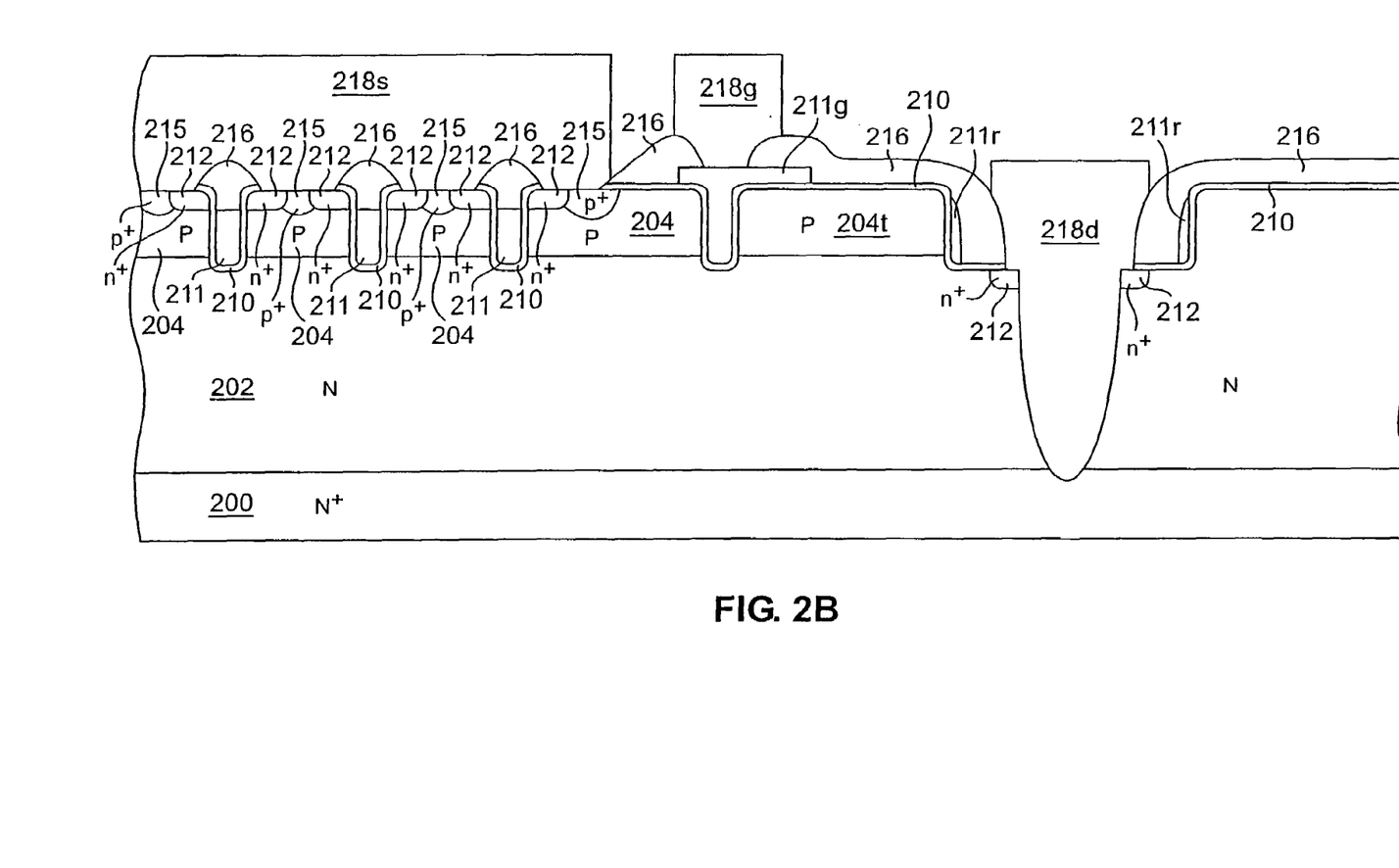
FIG. 2B is a schematic partial cross-sectional view of another trench DMOS transistor device, according to an embodiment of the present invention.

Another embodiment of the invention is shown in FIG. 2B, which incorporates a deep metal region, rather than a deep n+ region. This embodiment is the essentially the same as that of FIG. 2A, except that a deep n+ region 219 is no longer utilized. Instead, in this embodiment, the metal drain contact 218d is extended through the epitaxial layer 202 and into contact with the N+ substrate 200.

Still other embodiments are also envisioned. In some embodiments, for example, the deep n+ region 219 of FIG. 2A is replaced with a doped polysilicon region.

Such alternative embodiments have a common aspect in that a deep region is formed that provides a relatively low resistivity pathway over at least a portion of the distance from the surface of the epitaxial layer down to the substrate layer.

Typically, this deep region has a resistivity of 0.01 Ohm-cm or less, preferably 0.001 Ohm-cm or less.

The deep region can consist of a combination of low resistivity materials meeting this criterion. For example, the deep region can consist of a combination of doped single-crystal silicon, doped polycrystalline silicon and/or metal.

The deep region typically extends at least 20% of the distance from the upper surface of the epitaxial layer to the substrate. The deep region preferably extends all the way (i.e., 100% of the distance) to the substrate.

Although a single deep region is shown in FIG. 2A and FIG. 2B, multiple deep regions can be provided, which are preferably shorted through a single drain contact.

Figure 3A:
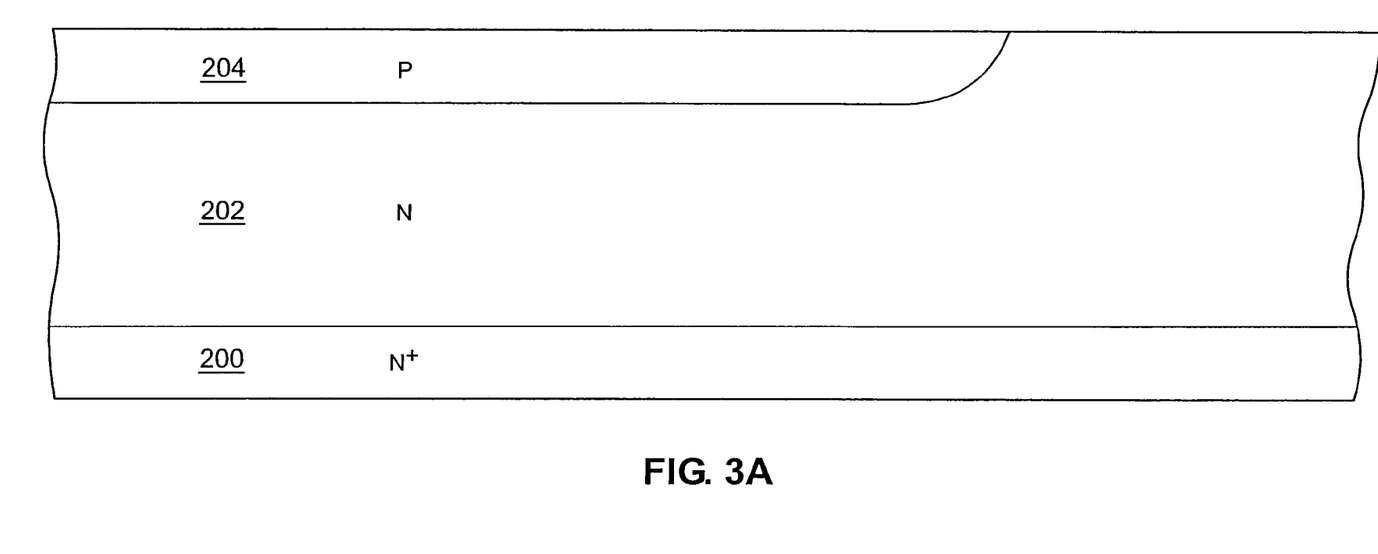
FIGS. 3A through 3F are schematic partial cross-sectional views illustrating a method of making the trench DMOS transistor device of FIG. 2A, according to an embodiment of the present invention.

In accordance with an embodiment of the present invention, a method for manufacturing the trench DMOS of FIG. 2A will now be described in connection with FIG. 3A through FIG. 3F. Turning now to FIG. 3A, an N doped epitaxial layer 202 is initially grown on an N+ doped substrate 200. For example, the epitaxial layer 202 can be 6.0 microns thick and have an n-type doping concentration of 3.4×1016 cm-3, while the N+ doped substrate 200 can be 250 microns thick and have an n-type doping concentration of 5×1019 cm-3. Using masking as appropriate, a P-type region 204 is then formed in the epitaxial layer 202 by implantation and diffusion. For example, the epitaxial layer 202 may be implanted with boron at 40 keV and a dosage of 6×1013 cm-2, followed by diffusion to a depth of 1.8 microns 1150° C. The resulting structure is shown in FIG. 3A.

A mask oxide layer (not shown) is then deposited, for example, by chemical vapor deposition, and patterned using a trench mask (not shown). Trenches are etched through apertures in the patterned mask oxide layer, typically by reactive ion etching. Trench depths in this example are about 2.0 µm. Discrete P-type regions 204 are established as a result of this trench-forming step. Some of these P-type regions 204 correspond to the body regions of the device cells. Others of these P-type regions 204t are involved in the termination of the trench segments.

A patterned masking layer (not shown) is then provided for the formation of a deep n+ region 219. In this example, the deep n+ region 219 is formed via an implantation and diffusion process. For example, the deep n+ region 219 may be implanted with phosphorus at a dosage of 1016 cm-2 and diffused to a depth of 3–7 microns at a temperature of 1150° C. This diffusion step can be performed in conjunction with the subsequent formation any sacrificial oxide layer, as well as the gate oxide layer.

Although the n+ region 219 is formed relatively early in the process illustrated, so as not to affect the distribution of the implanted dopants to follow, it will be appreciated by those of ordinary skill in the art that the n+ region 219 can be introduced at any number of points in the manufacturing process.

Figure 3B:
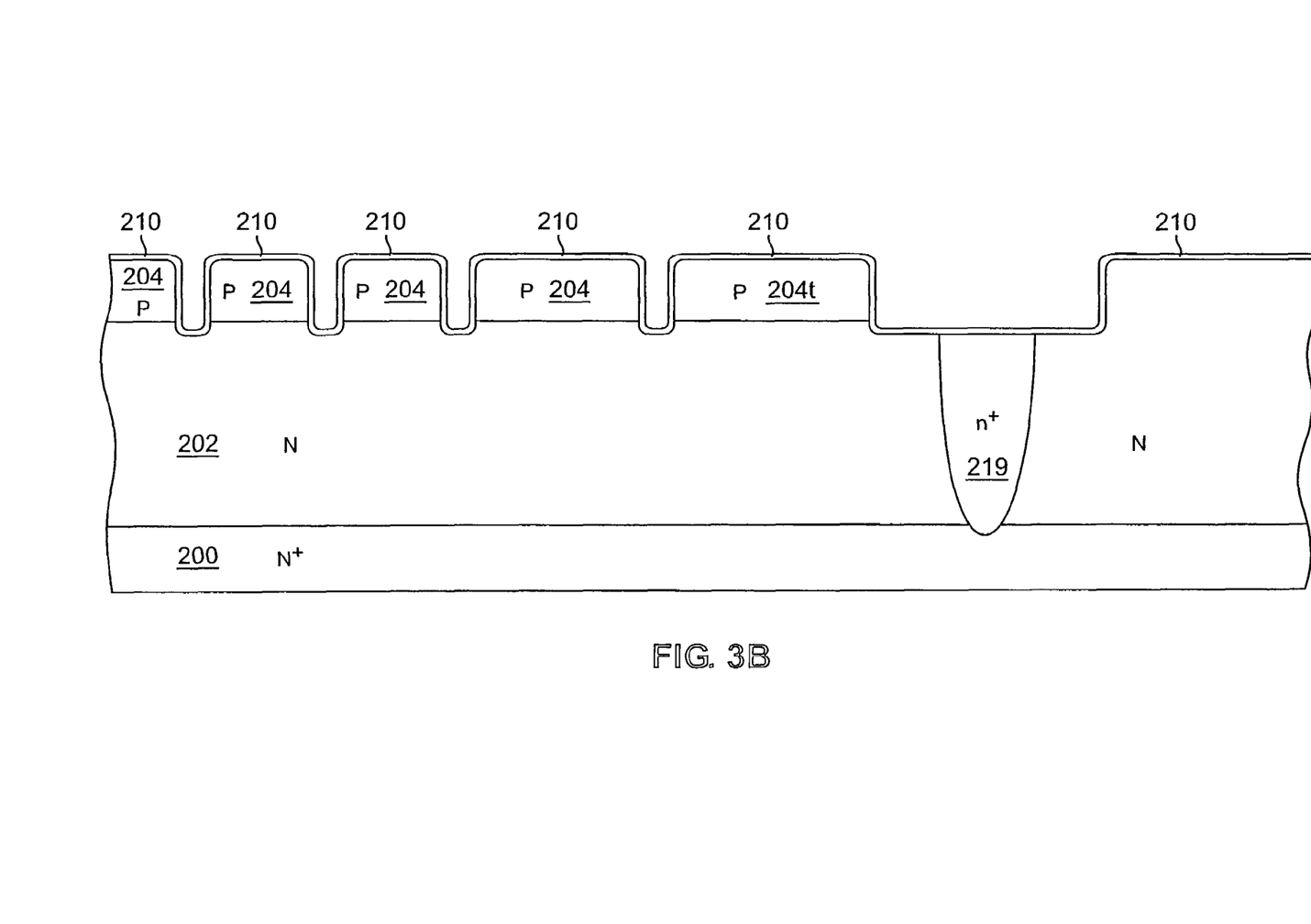

The patterned mask oxide layer and any sacrificial oxide is then removed and an oxide layer 210 is grown in its place, typically by dry oxidation at 950 to 1050° C. Portions of the oxide layer 210 ultimately form the gate oxide regions for the finished device. A thickness in the range of 500 to 700 Angstroms is typical for the oxide layer 210. The resulting structure is shown in FIG. 3B.

Figure 3C:
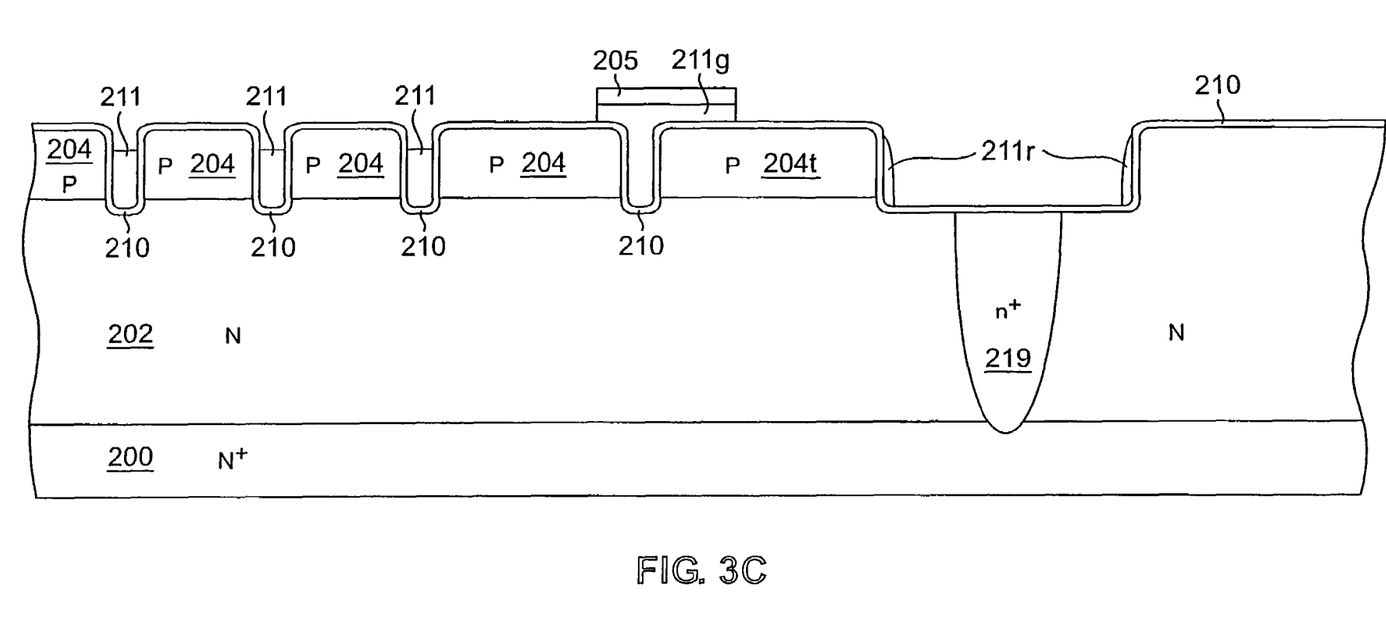

The surface of the structure is then covered, and the trenches are filled, with a polysilicon layer, typically using CVD. The polysilicon is typically doped N-type to reduce its resistivity, typically on order of 20 W/sq. N-type doping can be carried out, for example, during CVD with phosphorous chloride or by implantation with arsenic or phosphorous. The polysilicon layer is then etched, for example, by reactive ion etching. The polysilicon layer within the trench segments is commonly slightly over-etched due to etching uniformity concerns, and the thus-formed polysilicon gate regions 211 typically have top surfaces that are 0.1 to 0.2 microns below the adjacent surface of the epitaxial layer 204. Due to the width of the right-hand trench within the termination area, only small residual polysilicon regions 211r remain. A patterned masking layer 205 is used during etching to preserve polysilicon region 211 g in the gate runner region. The resulting structure is shown in FIG. 3C.

Figure 3D:
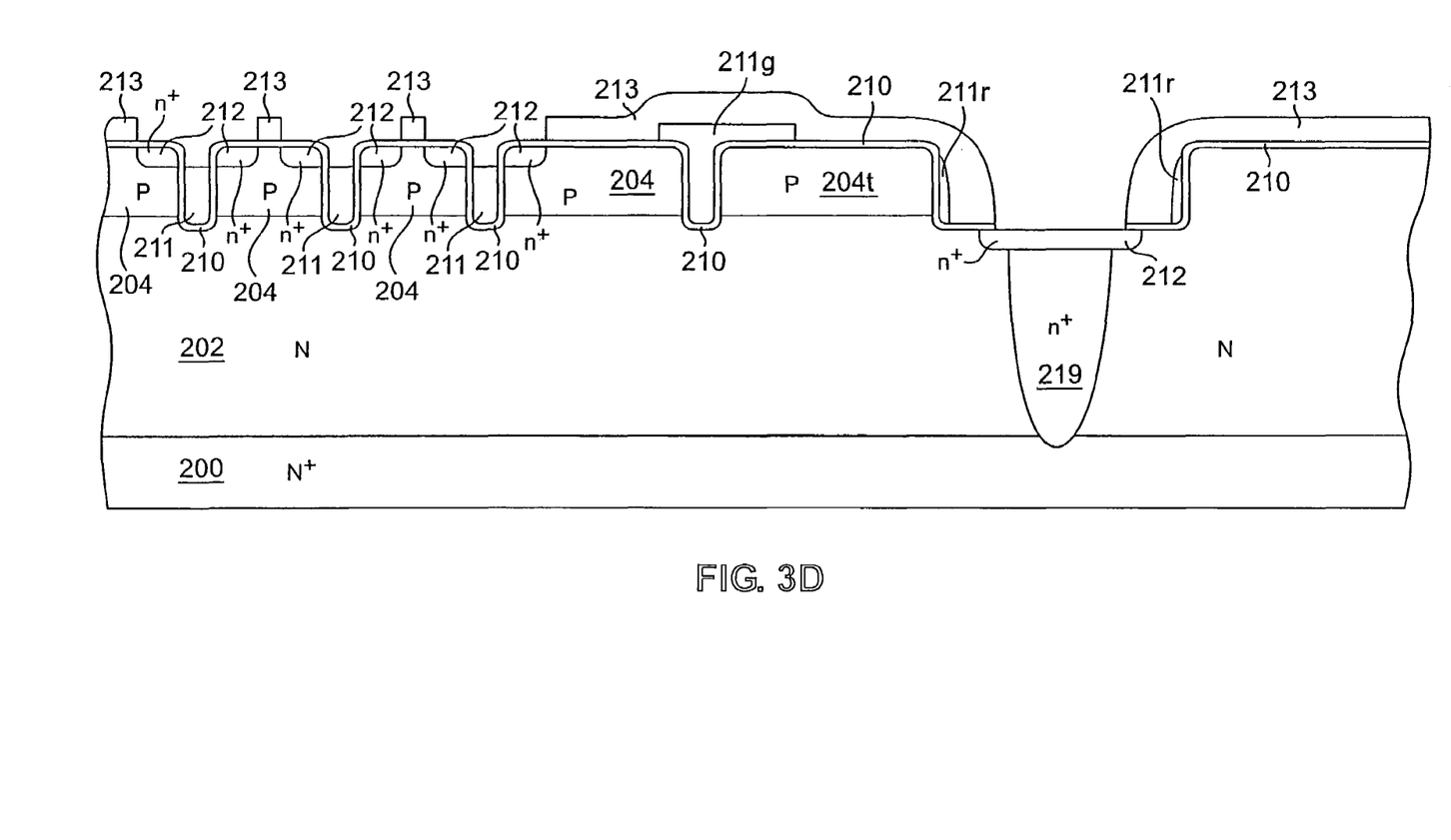

The patterned masking layer 205 is then removed, and the exposed oxide layer 210 is wet etched to a thickness of about 100 Angstroms to form an implant oxide. The implant oxide avoids implant-channeling effects, implant damage, and heavy metal contamination during subsequent formation of source regions. A patterned masking layer 213 is then provided, and n+ source regions 212 are formed in upper portions of the epitaxial layer in the cell region via an implantation and diffusion process. At the same time n+ regions 212 are also formed in the area of the deep n+ region 219, which can improve subsequent contact resistance. For example, the n+ regions 212 may be implanted with arsenic at a dosage of 1×1016 cm-2 and diffused to a depth of 0.4 microns at a temperature of 950° C. The resulting structure is shown in FIG. 3D.

Figure 3E:
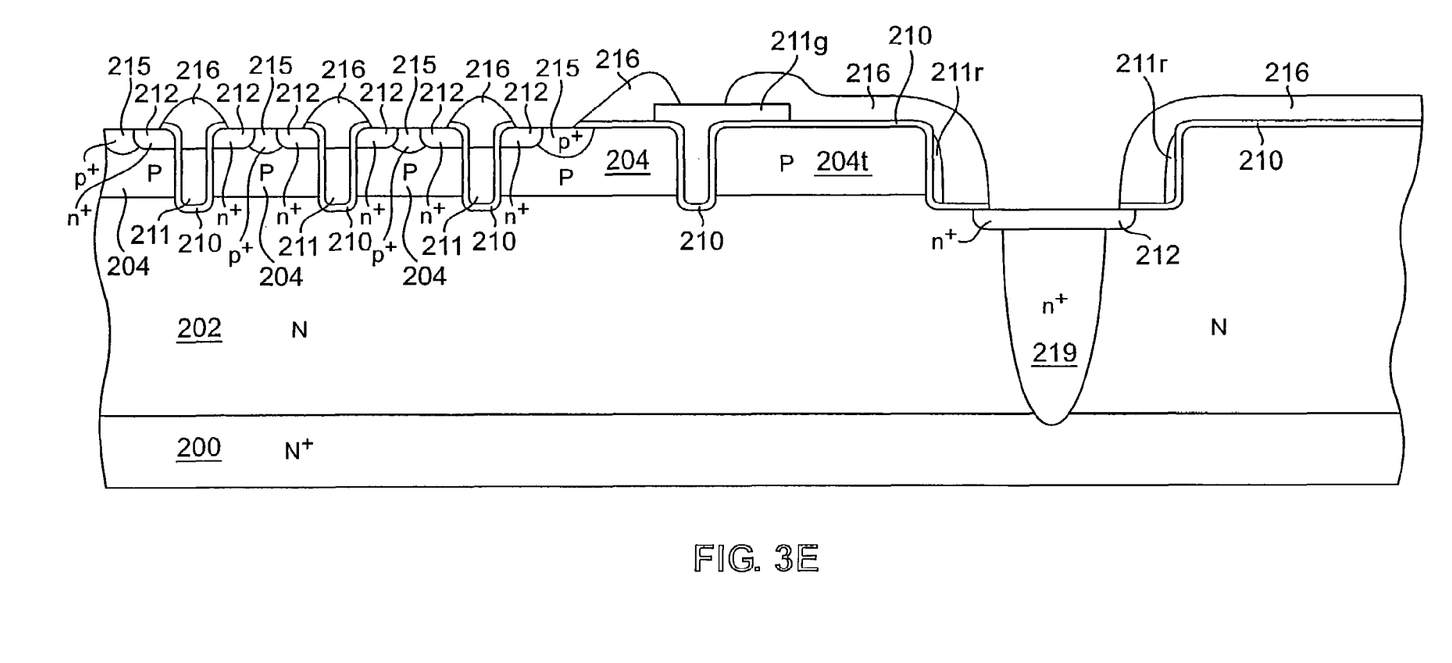
Figure 3F:
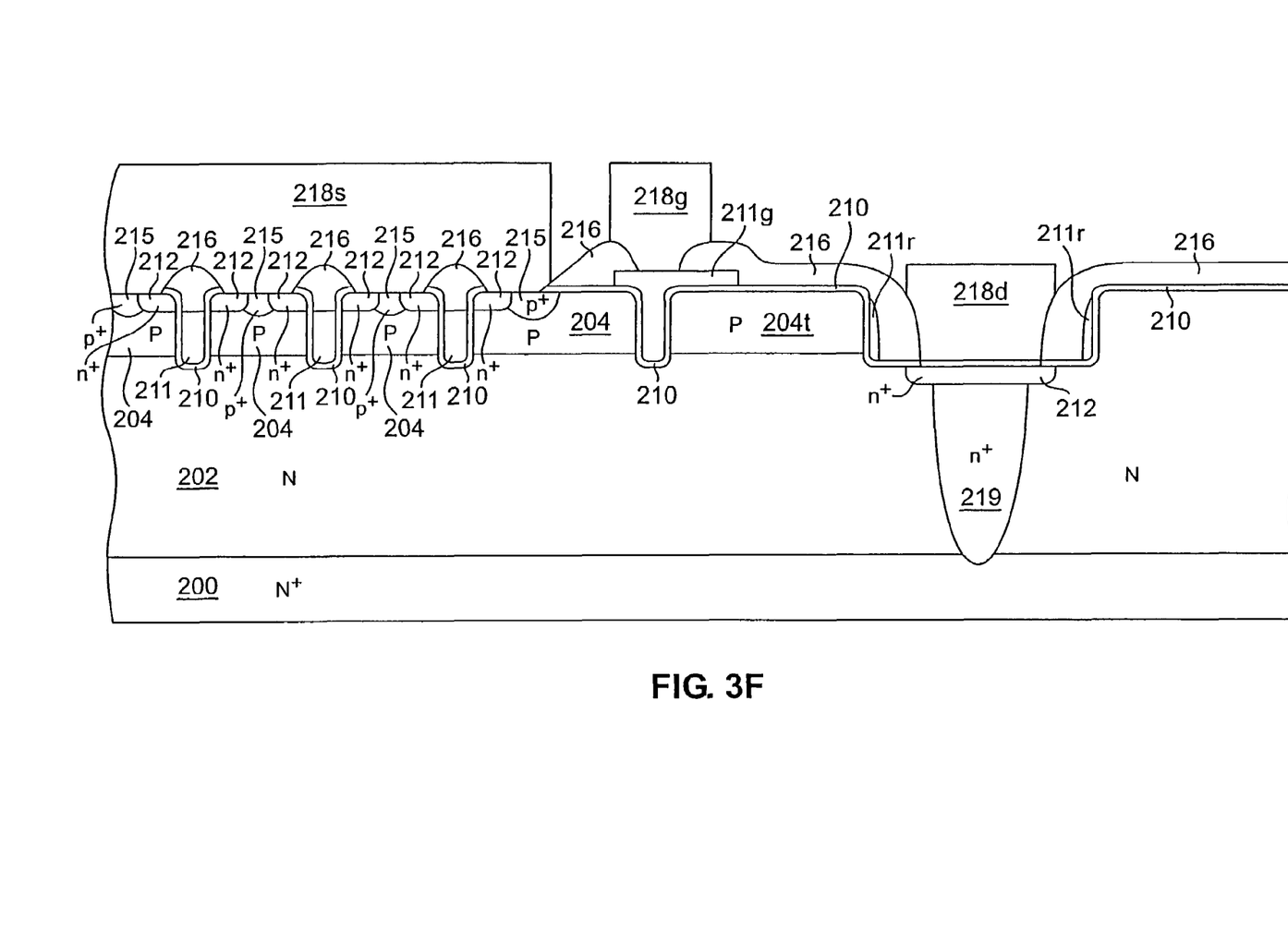

Patterned masking layer 213 is removed. An additional mask (not shown) is then formed, followed by implantation and diffusion of boron to form P-body upper portions 215 (p+ regions) between n+ regions 212. A BPSG (borophosphosilicate glass) layer is then formed over the entire structure, for example, by PECVD, and the structure is provided with a patterned photoresist layer (not shown). The structure is then etched, typically by reactive ion etching, to remove the BPSG and oxide layers 210 over selected portions of the structure, resulting in BPSG regions 216 after reflow. The patterned photoresist layer is then removed, resulting in the cross-sectional view of FIG. 3E.

Finally, a patterned photoresist layer (not shown) is provided and a contact layer (e.g., a metal contact layer such as aluminum) is deposited, forming source contact 218s, gate contact 218g and drain contact 218d. Removal of the photoresist layer results in the cross-section of FIG. 3F. As can be seen, source contact 218s contacts the n+ source regions 212, gate contact 218g contacts the polysilicon gate runner 211, and drain contact 218d contacts the N+ substrate 200 via deep n+ region 219. All contacts 218s, 218g and 218d are on the upper surface of the device.

Figure 4A:
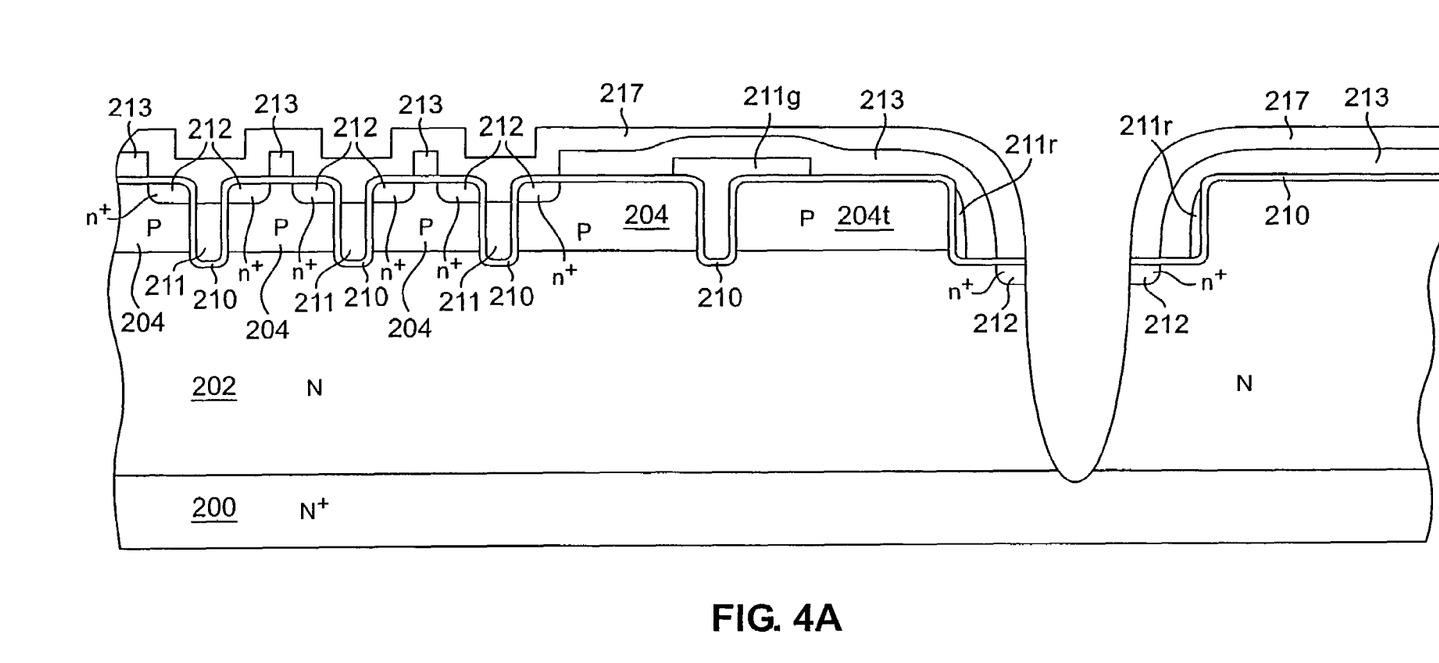
FIGS. 4A through 4C are schematic partial cross-sectional views illustrating a method of making the trench DMOS transistor device of FIG. 2B, according to an embodiment of the present invention.

Other options are available for forming the electrical connection with the N+ substrate 200 from the upper surface of the device. For example, a deep n+ region 219 need not be formed as in FIG. 3B above. Instead, after providing n+ regions 212 as discussed in FIG. 3D, an etch resistant layer can be provided in the form of patterned masking layer 217. The structure is then etched, for example, by reaction ion etching to produce the deep-trench structure shown in FIG. 4A. Of course, the deep trench can be performed elsewhere in the process if desired.

Figure 4B:
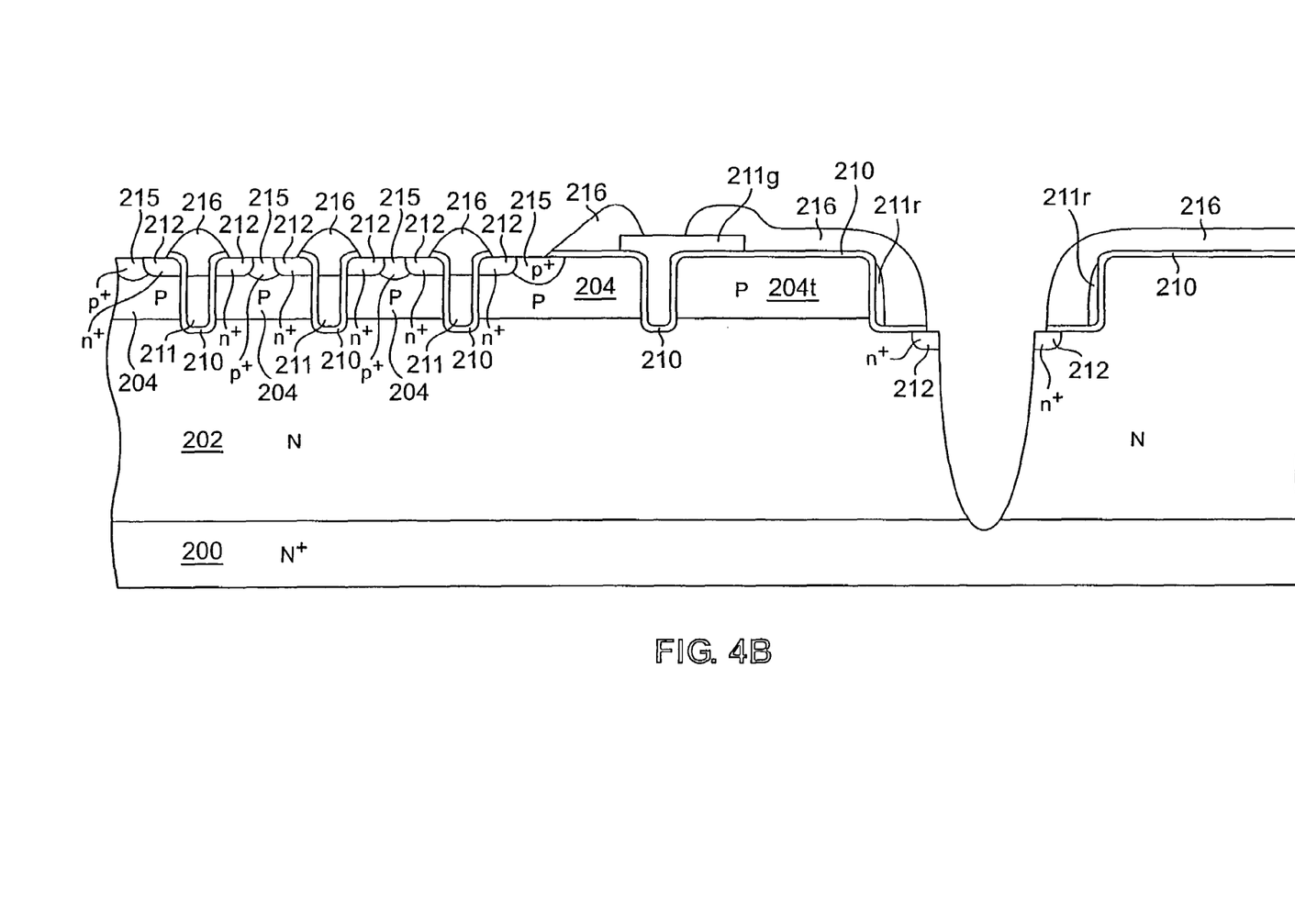

Continuing with this specific example, patterned masking layers 213 and 217 are then removed, and the above procedures are followed (i.e., implantation and diffusion of p+ regions 215 and deposition and patterning of BPSG regions 216) to produce a structure like that of FIG. 4B.

Figure 4C:
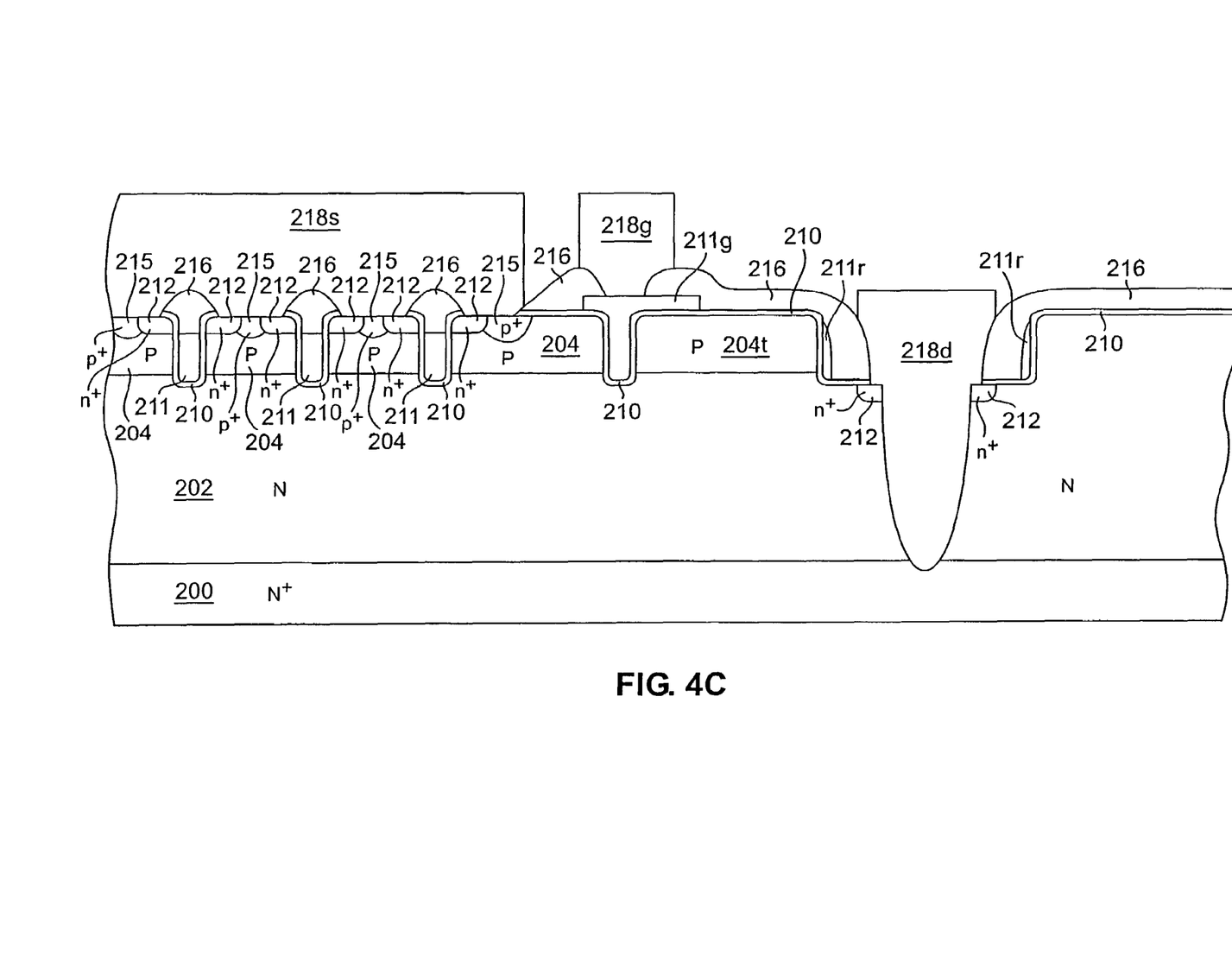

Finally, metal contacts are also formed as above, except that one or more additional metal deposition steps are used to fill the deep trench, resulting in a structure like that of FIG. 4C.

Still other options are envisioned. For example, instead of filling the deep trench with metal, it can be filled with polysilicon, followed by deposition of a drain contact. The polysilicon can be provided, for example, by covering the structure (and filling the deep trench) with polysilicon. The polysilicon can then be etched such that only the polysilicon in the deep trench remains. The drain contact is subsequently deposited as above.

Although various embodiments are specifically illustrated and described herein, it will be appreciated that modifications and variations of the present invention are covered by the above teachings and are within the purview of the appended claims without departing from the spirit and intended scope of the invention. As one example, the method of the present invention may be used to form a structure in which the conductivities of the various semiconductor regions are reversed from those described herein.

The invention claimed is:

1. A method of forming a trench DMOS transistor device comprising:
   providing a substrate of a first conductivity type, said substrate acting as a common drain region for said device;
   depositing an epitaxial layer of said first conductivity type over said substrate, said epitaxial layer having a lower majority carrier concentration than said substrate;
   forming a body region of a second conductivity type within an upper portion of said epitaxial layer;
   etching a trench extending into said epitaxial layer from an upper surface of said epitaxial layer;
   forming an insulating layer lining at least a portion of said trench;
   forming a low resistivity deep region of said first conductivity type below a portion of said trench previously formed, the deep region extending from an upper surface of the epitaxial layer into the substrate, said deep region acting to provide electrical contact with said substrate;
   forming a conductive region within said trench adjacent said insulating layer; and
   forming a region of said first conductivity type within an upper portion of said epitaxial layer over the deep region, wherein the region within the upper portion of said epitaxial layer completely overlies the deep region.

2. The method of claim 1, wherein the region of first conductivity formed within the upper portion of said exitaxial layer is formed by implantation and diffusion.

* * * * *

UNITED STATES PATENT AND TRADEMARK OFFICE
CERTIFICATE OF CORRECTION

PATENT NO. : 7,049,194 B2  Page 1 of 1
APPLICATION NO. : 10/725326
DATED : May 23, 2006
INVENTOR(S) : Fwu-Iuan Hshieh et al.

It is certified that error appears in the above-identified patent and that said Letters Patent is hereby corrected as shown below:

Col. 5, line 3, after "is", delete "the".

Col. 5, line 63, after "formation", add --of--.

Col. 6, line 26, change "211 g" to --211g--.

Col. 8, line 30, Claim 2, change last word "exi-" to --epi- --, so that the word ending line 30 and beginning line 31 is "epitaxial".

Signed and Sealed this

Nineteenth Day of June, 2007

JON W. DUDAS
*Director of the United States Patent and Trademark Office*